US009487019B2

(12) United States Patent
Taguchi

(10) Patent No.: US 9,487,019 B2
(45) Date of Patent: Nov. 8, 2016

(54) LIGHT IRRADIATION DEVICE, LIGHT IRRADIATION MODULE, AND PRINTING APPARATUS

(71) Applicant: KYOCERA Corporation, Kyoto-shi, Kyoto (JP)

(72) Inventor: Akira Taguchi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/647,326

(22) PCT Filed: Nov. 22, 2013

(86) PCT No.: PCT/JP2013/081530
§ 371 (c)(1),
(2) Date: May 26, 2015

(87) PCT Pub. No.: WO2014/084143
PCT Pub. Date: Jun. 5, 2014

(65) Prior Publication Data
US 2015/0314614 A1 Nov. 5, 2015

(30) Foreign Application Priority Data
Nov. 29, 2012 (JP) ................................. 2012-260500

(51) Int. Cl.
*B41J 2/435* (2006.01)
*B01J 19/12* (2006.01)
(Continued)

(52) U.S. Cl.
CPC ................. *B41J 2/435* (2013.01); *B01J 19/12* (2013.01); *B41F 23/04* (2013.01); *B41J 2/01* (2013.01); *B41J 11/002* (2013.01); *F21S 2/00* (2013.01); *F21V 5/00* (2013.01); *F21V 5/04* (2013.01); *G02B 19/0019* (2013.01);
(Continued)

(58) Field of Classification Search
None
See application file for complete search history.

(56) References Cited

U.S. PATENT DOCUMENTS

| 2003/0189829 A1 | 10/2003 | Shimizu et al. |
| 2005/0207165 A1 | 9/2005 | Shimizu et al. |

(Continued)

FOREIGN PATENT DOCUMENTS

| EP | 2528123 A1 | 11/2012 |
| JP | 08-116041 A | 5/1996 |

(Continued)

OTHER PUBLICATIONS

International Search Report, PCT/JP2013/081530, Mar. 4, 2014, 2 pgs.

(Continued)

*Primary Examiner* — Bradley Thies
(74) *Attorney, Agent, or Firm* — Volpe and Koenig, P.C.

(57) ABSTRACT

A light irradiation device for applying light to a target object under relative movement includes: a base; first light-emitting element groups located on an upstream side in a direction of object movement, and second light-emitting element groups located on a downstream side, which are arranged on one main surface of the base; and first lenses and second lenses which cover the respective first light-emitting element groups and the respective second light-emitting element groups, respectively. An optical axis of light emitted through each of the first lenses is inclined toward the downstream side in the direction of object movement with respect to a normal to the one main surface of the base. An optical axis of light emitted through each of the second lenses is inclined toward the upstream side.

9 Claims, 8 Drawing Sheets

(51) Int. Cl.
   *B41J 2/01* (2006.01)
   *B41F 23/04* (2006.01)
   *F21S 2/00* (2016.01)
   *F21V 5/00* (2015.01)
   *F21V 5/04* (2006.01)
   *G02B 19/00* (2006.01)
   *B41J 11/00* (2006.01)
   *H01L 33/58* (2010.01)

(52) U.S. Cl.
   CPC .......... *G02B 19/0066* (2013.01); *H01L 33/58* (2013.01); *H01L 2224/45144* (2013.01); *H01L 2224/48091* (2013.01); *H01L 2224/73265* (2013.01)

(56) References Cited

U.S. PATENT DOCUMENTS

| | | |
|---|---|---|
| 2005/0237747 A1 | 10/2005 | Shimizu et al. |
| 2005/0242362 A1 | 11/2005 | Shimizu et al. |
| 2006/0160409 A1 | 7/2006 | Shimizu et al. |
| 2007/0184141 A1 | 8/2007 | Custer |
| 2007/0187708 A1 | 8/2007 | Setomoto et al. |
| 2008/0074887 A1* | 3/2008 | Nakata ................... B41J 11/002 362/310 |
| 2009/0160923 A1 | 6/2009 | Custer |
| 2013/0056767 A1* | 3/2013 | Tanaka ................ B41F 23/0453 257/89 |

FOREIGN PATENT DOCUMENTS

| | | |
|---|---|---|
| JP | 09-164717 A | 6/1997 |
| JP | 2003-124528 A | 4/2003 |
| JP | 2008-080224 A | 4/2008 |
| JP | 2011-177974 A | 9/2011 |
| JP | 2011177974 A * | 9/2011 |
| JP | 2011-204397 A | 10/2011 |
| JP | 2012-091123 A | 5/2012 |
| JP | 2012-114384 A | 6/2012 |
| JP | 2012114384 A * | 6/2012 |

OTHER PUBLICATIONS

Extended European Search Report, European Patent Application No. 13859410.6, Jun. 24, 2016, 7 pgs.

* cited by examiner

DIRECTION OF OBJECT MOVEMENT

DIRECTION OF
OBJECT MOVEMENT

LIGHT IRRADIATION DEVICE, LIGHT IRRADIATION MODULE, AND PRINTING APPARATUS

TECHNICAL FIELD

The present invention relates to a light irradiation device used for curing an ultraviolet curable resin or paint, a light irradiation module, and a printing apparatus.

BACKGROUND ART

Ultraviolet irradiation apparatuses have hitherto been used for general purposes, including fluorescence reaction observations in the fields of medicine, biotechnology, and so forth, disinfection, the adhesion of electronic components, and the curing of an ultraviolet curable resin and ink. In particular, a high-pressure mercury lamp, a metal halide lamp, or the like is used as a lamp light source of an ultraviolet irradiation apparatus for use in the curing of an ultraviolet curable resin used for the adhesion of a miniaturized component in the field of electronic components, the curing of an ultraviolet curable ink used in the field of printing, or like purposes.

In recent years, from the viewpoint of lessening the burden on the environment, an ultraviolet light-emitting element has been adopted for use as a lamp light source because of its longer service life, greater energy efficiency, and capability of suppression of ozone generation.

An ultraviolet light-emitting element has a relatively low irradiance, and therefore, for example, as described in Japanese Unexamined Patent Publication JP-A 2003-124528, a device constructed by mounting a plurality of light-emitting elements on a single substrate is commonly used. Thus, ultraviolet irradiation energy required for curing an ultraviolet curable ink can be secured.

In such a device, however, although it is possible to secure the ultraviolet irradiation energy for irradiation in terms of integrated quantity, the intensity of ultraviolet irradiation per unit area is not high, which may cause insufficient curing.

SUMMARY OF INVENTION

Technical Problem

An object of the invention is to provide a light irradiation device which is capable of exhibiting high ultraviolet irradiation intensity per unit area even in a device constructed by mounting a plurality of light-emitting elements on a single substrate; a light irradiation module; and a printing apparatus.

Solution to Problem

The invention provides a light irradiation device for applying light to a target object under relative movement, comprising: a base; a plurality of light-emitting element groups, each of groups having a plurality of light-emitting elements, the plurality of light-emitting elements being arranged in a matrix form on an upper surface of the base; and a plurality of lenses configured to cover the respective light-emitting element groups, the plurality of lenses radiating light emitted from the light-emitting element groups outwardly. The plurality of light-emitting element groups include: a plurality of first light-emitting element groups located on an upstream side in a movement direction in which the target object is moved relative to the light irradiation device; and a plurality of second light-emitting element groups located on a downstream side in the movement direction. The plurality of lenses include: a plurality of first lenses which cover the respective first light-emitting element groups; and a plurality of second lenses which cover the respective second light-emitting element groups. An optical axis of light emitted through each of the plurality of first lenses is inclined toward the downstream side in the movement direction with respect to a normal to the upper surface of the base. An optical axis of light emitted through each of the plurality of second lenses is inclined toward the upstream side in the movement direction with respect to a normal to the upper surface of the base.

The invention provides a light irradiation module, comprising: a heat-dissipating member; and a plurality of the above-mentioned light irradiation devices disposed on the heat-dissipating member.

The invention provides a printing apparatus comprising: a printing part configured to print on a recording medium; and the above-mentioned light irradiation module which applies light to a recording medium printed.

Advantageous Effects of Invention

According to the light irradiation device according to the invention, it is possible to increase the intensity of light per unit area in a device constructed by mounting a plurality of light-emitting elements on a single substrate.

DESCRIPTION OF EMBODIMENTS

Hereinafter, embodiments of a light irradiation device, a light irradiation module, and a printing apparatus according to the invention will be described with reference to drawings. It is noted that the following forms of the invention are given as illustrative only of embodiments of the invention, and thus the application of the invention is not limited to the embodiments as set forth herein.

(Light Irradiation Device)

A light irradiation device of the present embodiment acts as an ultraviolet-producing light source which is incorporated into a printing apparatus, such as an offset printer or ink-jet printer using an ultraviolet curable ink, for applying ultraviolet light to a target object (recording medium) under relative movement after adhesion of an ultraviolet curable ink in order to cure the ultraviolet curable ink adherent to the object.

Figure 1:
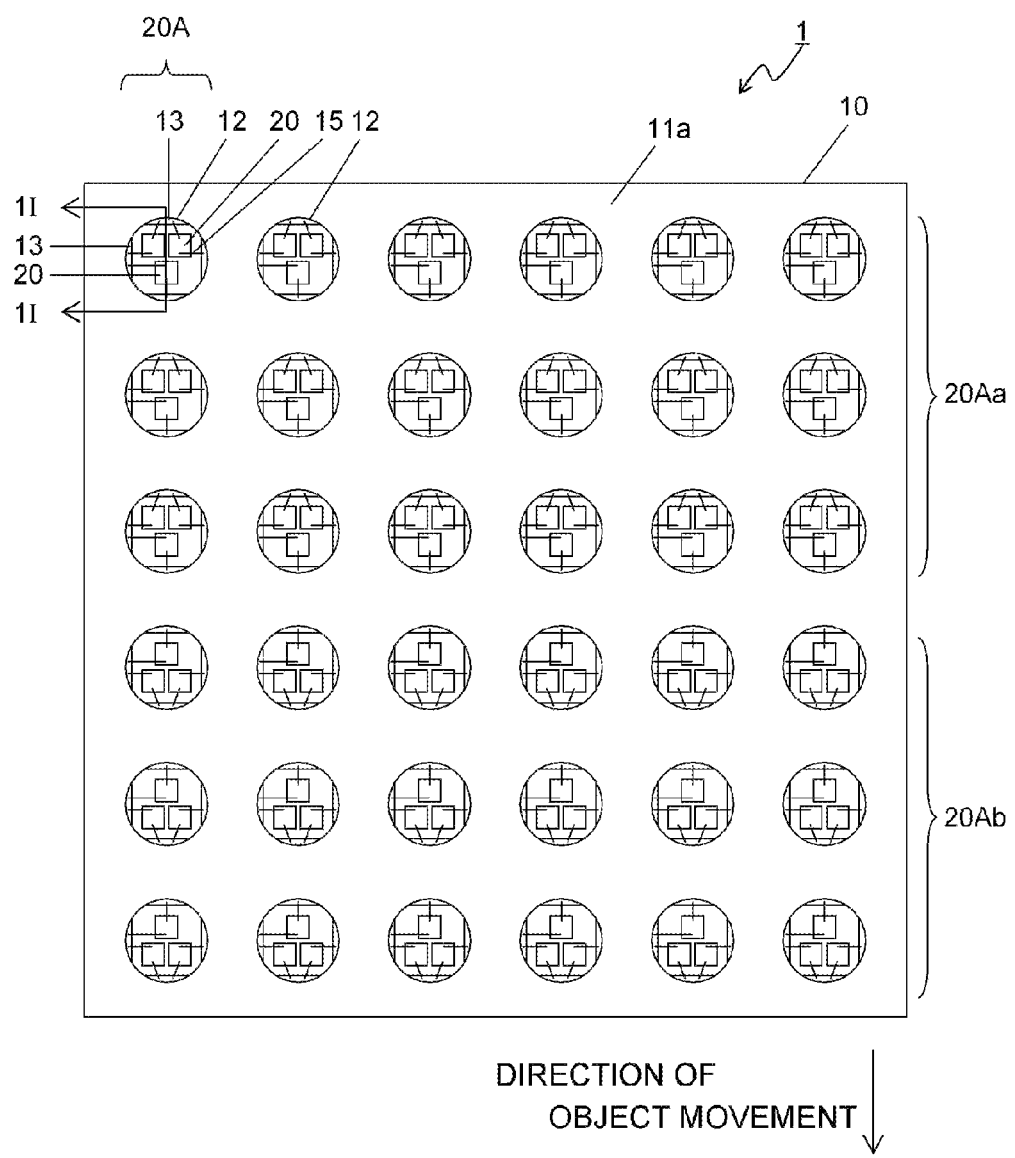
FIG. 1 is a plan view showing one embodiment of a light irradiation device.
Figure 2:
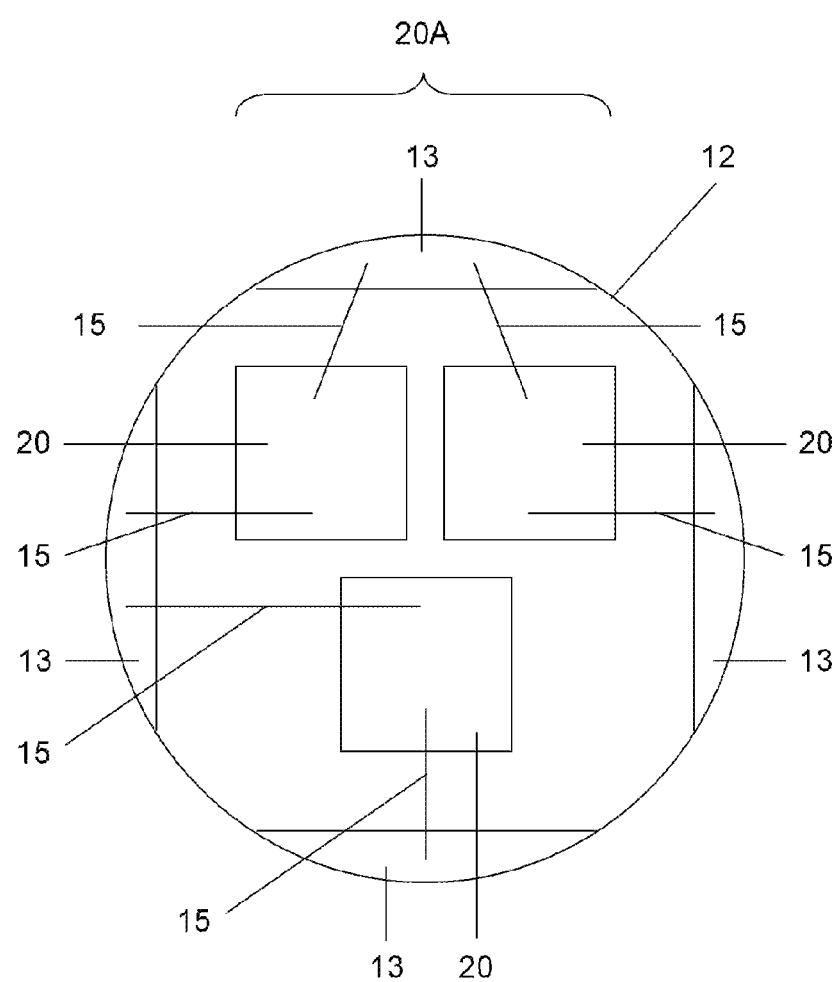
FIG. 2 is a plan view of the main part of the light irradiation device shown in FIG. 1.
Figure 3:
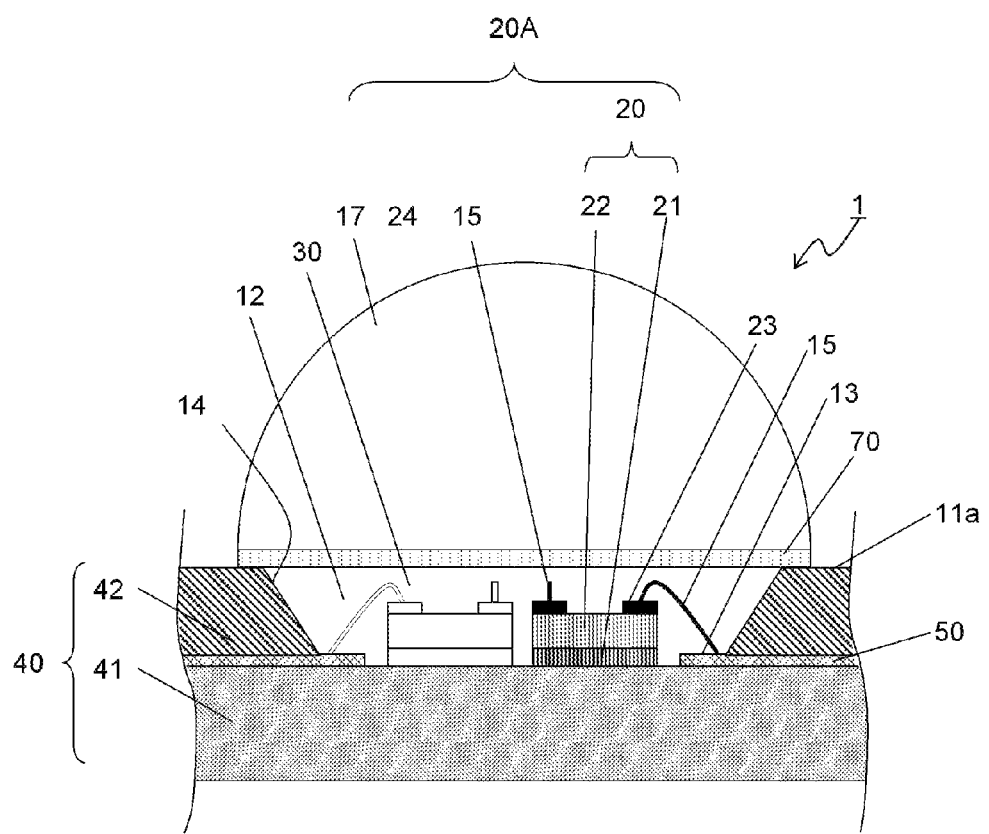
FIG. 3 is a sectional view of the light irradiation device taken along the line 1I-1I shown in FIG. 1.

As shown in FIGS. 1 to 3, a light irradiation device 1 comprises: a base 10 having a plurality of openings 12 formed in one main surface 11a thereof; a plurality of connection pads 13 disposed inside each of the openings 12; a plurality of light-emitting elements 20 disposed inside each of the openings 12 of the base 10 so as to be electrically connected to the connection pads 13; a plurality of sealing materials 30 filled in the respective openings 12 to cover the light-emitting elements 20; and a plurality of lenses 17 provided in correspondence to the openings 12, respectively.

The base 10 comprises: a stacked body 40 in which a first insulating layer 41 and a second insulating layer 42 are laminated; and electrical wiring 50 for providing connection between separate light-emitting elements 20. The base 10 is rectangular-shaped as seen in a plan view from above one main surface 11a, and, the plurality of light-emitting elements 20 are supported within the opening 12 formed in the one main surface 11a.

A plurality of (in this embodiment, three) light-emitting elements 20 are placed inside each of the openings 12, thereby constituting a light-emitting element group 20A. These light-emitting element groups 20A of the present embodiment include: a plurality of first light-emitting element groups 20Aa located on an upstream side in a direction of object movement; and a plurality of second light-emitting element groups 20Ab located on a downstream side in the direction of object movement.

For example, the first insulating layer 41 is made of ceramics such as an aluminum oxide sintered body, an aluminum nitride sintered body, a mullite sintered body, or glass ceramics, or a resin such as epoxy resin or a liquid crystal polymer (LCP).

The electrical wiring 50 is formed, in a predetermined pattern, from an electrically conductive material such for example as tungsten (W), molybdenum (Mo), manganese (Mn), or copper (Cu), and acts as feeder wiring for supplying electric current to the light-emitting element 20 or electric current from the light-emitting element 20.

The second insulating layer 42 laminated on the first insulating layer 41 has the openings 12 formed so as to pass therethrough.

Each of the openings 12 has an inner peripheral surface 14 inclined so that a hole diameter becomes larger gradually from a light-emitting element 20-placement surface to one main surface 11a of the base 10, and, as seen in a plan view, a shape of the opening 12 is defined by a circle, for example. Note that the opening shape is not limited to the circular shape, but may be of a rectangular shape.

Such an opening 12 acts as a reflection plate in which light emitted from the light-emitting element 20 is reflected upwardly by the inner peripheral surface 14 for enhancement in light extraction efficiency.

In order to increase the light extraction efficiency, the second insulating layer 42 may be formed of a porous ceramic material which exhibits a relatively good reflectivity to light in the ultraviolet range, for example, an aluminum oxide sintered body, a zirconium oxide sintered body, or an aluminum nitride sintered body. Moreover, from the viewpoint of increasing the light extraction efficiency, a metal-made reflection film may be provided on the inner peripheral surface 14 of the opening 12.

The openings 12 are arranged in a matrix form over the entire area of the upper surface, or equivalently one main surface 11a of the base 10. In the present embodiment, the openings 12 are placed in a rectangular lattice arrangement.

When it is desired to increase the intensity of light per unit area, for example, the openings may be placed in a staggered arrangement, that is; they are placed in zigzag form in plural rows, so that the light-emitting elements 20, namely the light-emitting element groups 20A can be arranged more densely. The term "staggered arrangement" is used herein for the same meaning as an arrangement such that the openings are located at lattice points of a slanting lattice. Moreover, the light-emitting element group 20A composed of plural light-emitting elements 20 is placed inside the opening 12, wherefore the arrangement of the openings 12 is construed as being equivalent to the arrangement of the light-emitting element groups 20A.

In the present embodiment, the light-emitting element group 20A is placed inside the opening 12, but, the opening 12 does not necessarily have to be provided, and therefore, a plurality of light-emitting elements 20 may be placed simply on the first insulating layer 41. Moreover, the second insulating layer 42 may be formed on the first insulating layer 41 as a thin layer which serves the purpose of providing protection for the electrical wiring 50.

The base 10 comprising the stacked body 40 composed of the first insulating layer 41 and the second insulating layer 42 thus far described is, in a case where the first insulating layer 41 and the second insulating layer 42 are made of ceramics or the like, produced by following procedural steps as set forth hereunder.

At first, a plurality of ceramic green sheets produced in a usual manner are prepared. A hole which serves as the opening 12 is formed in an assigned ceramic green sheet by means of punching or otherwise. Next, after a metal paste which constitutes the electrical wiring 50 is printed onto the green sheets (not shown in the drawing), the green sheets are laminated together so that the printed metal paste can be interposed between the green sheets. Exemplary of the metal paste constituting the electrical wiring 50 is a paste containing a metal material such for example as tungsten (W), molybdenum (Mo), manganese (Mn), or copper (Cu). Next, the resultant laminate is fired, that is; the green sheets and the metal pastes are fired all together, whereupon the base 10 having the electrical wiring 50 and the opening 12 can be formed.

Moreover, in a case where the first insulating layer 41 and the second insulating layer 42 are made of resin, for example, the following method can be considered as a way to produce the base 10.

At first, precursor sheets of a thermosetting resin are prepared. Next, a metal-made lead terminal which constitutes the electrical wiring 50 is placed between the precursor sheets, and the a plurality of precursor sheets are laminated together so that the lead terminal can be buried in the precursor sheets. Exemplary of the material constituting the lead terminal is a metal material such for example as copper (Cu), silver (Ag), aluminum (Al), an iron (Fe)-nickel (Ni)-cobalt (Co) alloy, or an iron (Fe)-nickel (Ni) alloy. After a hole which serves as the opening 12 is formed in the precursor sheets by means of lasering, etching, or otherwise, the precursor sheets are cured under heat, whereupon the production of the base 10 is completed. In a case where the opening 12 is formed by means of lasering, the formation of the opening 12 may be carried out after curing the precursor sheets under heat.

Meanwhile, inside the opening 12 of the base 10, there are provided: a plurality of connection pads 13 electrically connected to a plurality of light-emitting elements 20; the plurality of light-emitting elements 20 connected to the connection pads 13 via joining materials 15 such as solder, gold (Au) wires, aluminum (Al) wires, or the like; and a sealing material 30 for sealing the plurality of light-emitting elements 20.

The connection pad 13 is constructed of a metal layer made of a metal material such for example as tungsten (W), molybdenum (Mo), manganese (Mn), or copper (Cu). Note that, for example, a nickel (Ni) layer, a palladium (Pd) layer, or a gold (Au) layer may additionally be laminated on the metal layer on an as needed basis. Such a connection pad 13 is connected to the light-emitting element 20 via the joining material 15 such as solder, a gold (Au) wire, an aluminum (Al) wire, or the like.

Moreover, for example, the light-emitting element 20 is constructed of a light-emitting diode obtained by laminating an n-type semiconductor layer and a p-type semiconductor layer made of a semiconductor material such as gallium arsenide (GaAs) or gallium nitride (GaN) on an element substrate 21 such as a sapphire substrate, or an organic EL element having an organic material-made semiconductor layer.

The light-emitting element 20 comprises: a semiconductor layer 22 having a light-emitting layer; and element electrodes 23 and 24 made of a metal material such as silver (Ag), which are connected to the connection pad 13 placed on the base 10 via the joining material 15, and, the light-emitting element 20 is connected to the base 10 by means of wire bonding. In response to an electric current flowing between the element electrodes 23 and 24, the light-emitting element 20 emits light having a predetermined wavelength at a predetermined luminance. Note that the element substrate 21 may be omitted. Moreover, the connection between the element electrode 23, 24 of the light-emitting element 20 and the connection pad 13 may be effected by means of customary flip-chip bonding technique using solder as the joining material 15.

The present embodiment adopts a LED which serves as the light-emitting element 20 for emitting UV light exhibiting a light emission spectrum whose peak wavelength falls in the range of, for example, 280 to 440 nm. That is, in the present embodiment, a UV-LED element is adopted for use as the light-emitting element 20. Note that the light-emitting element 20 is formed by means of commonly-used thin-film forming technique.

The light-emitting element 20 is sealed by the aforementioned sealing material 30.

An insulating material such as a light-transmittable resin material is used as the sealing material 30, and, by sealing the light-emitting element 20 successfully, it is possible to prevent intrusion of moisture from outside, as well as to absorb external impact, and thereby provide protection for the light-emitting element 20.

Moreover, the use of a material having a refractive index which falls in between the refractive index of the element substrate 21 constituting the light-emitting element 20 (in the case of using a sapphire substrate, the refractive index is 1.7) and the refractive index of air (about 1.0), for example, the use of a silicone resin (refractive index: about 1.4) as the sealing material 30 makes it possible to increase the efficiency of extraction of light from the light-emitting element 20.

Such a sealing material 30 can be formed by, after the light-emitting element 20 is mounted on the base 10, charging a precursor of a silicone resin or the like into the opening 12, and subsequently curing the resin.

The lens 17 is disposed on the above-mentioned sealing material 30, via a second adhesive 70, so as to cover the light-emitting element group 20A. In the light irradiation device 1 of the present embodiment, a plano-convex lens is used as the optical lens 17. Thus, the optical lens 17 of the present embodiment is so configured that one main surface is convexly curved, whereas the other main surface is made flat, that is; the optical lens 17 is so shaped that its cross-sectional area becomes smaller gradually from the other main surface to one main surface.

The optical lens 17, which is made for example of silicone, has the capability of condensing light emitted from the light-emitting element group 20A. Examples of the material constituting the optical lens include, in addition to silicone as mentioned above, plastics such as a thermosetting resin such as urethane resin or epoxy resin, and a thermoplastic resin such as polycarbonate resin or acryl resin; sapphire; and inorganic glass.

Moreover, the lenses 17 include: a plurality of first lenses 17a located on the upstream side in the direction of object movement; and a plurality of second lenses 17b located on the downstream side in the direction of object movement. The first lenses 17a are configured to cover the respective first light-emitting element groups 20Aa, and the second lenses 17b are configured to cover the respective second light-emitting element groups 20Ab. Hence, in the present embodiment, since the first light-emitting element groups 20Aa and the second light-emitting element groups 20Ab are placed in a rectangular lattice arrangement, it follows that an arrangement interval in the direction of object movement between the plurality of first lenses 17a and an arrangement interval in the direction of object movement between the plurality of second lenses 17b are equal to each other, as well as an arrangement interval in a direction perpendicular to the direction of object movement between the plurality of first lenses 17a and an arrangement interval in the direction perpendicular to the direction of object movement between the plurality of second lenses 17b are equal to each other. In this construction, it is possible to place the plurality of first lenses 17a and the plurality of second lenses 17b densely in a compact arrangement, and thereby conduce to downsizing of the light irradiation device 1.

A center of each of the plurality of first lenses 17a as seen in a plan view is located at the downstream side in the direction of object direction with respect to a center of the respective first light-emitting element group 20Aa as seen in a plan view, and, a center of each of the plurality of second lenses 17b as seen in a plan view is located at the upstream side in the direction of object movement with respect to a center of the respective second light-emitting element group 20Ab as seen in a plan view.

As employed herein, the term "center of each of the first light-emitting element group 20Aa and the second light-emitting element group 20Ab" refers to the centroid of the plan view showing the plurality of light-emitting elements 20 provided in the first light-emitting element group 20Aa. The centroid is determined by dividing geometrical moment of area in a given point by total cross-sectional area.

A method for determining the centroid will be described specifically with reference to FIG. 4.

Figure 4:
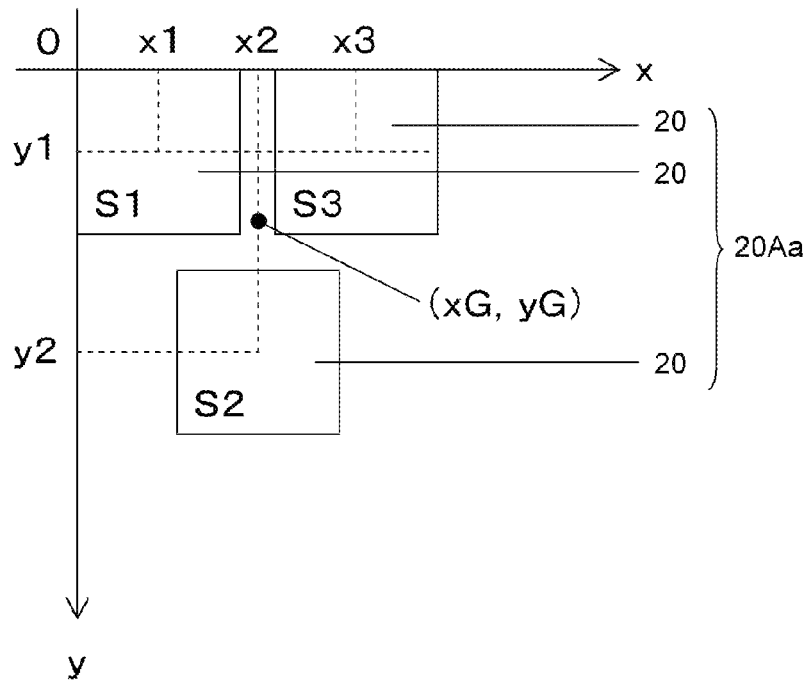
FIG. 4 is a view for explaining a method for centroid determination.

FIG. 4 schematically shows three light-emitting elements 20 of the first light-emitting element group 20Aa of the present embodiment. The upper left-hand corner of the light-emitting element 20 located in the upper left part of FIG. 4 is defined as an origin O. Given that the cross-sectional areas of the upper-left light-emitting element 20, the lower-central light-emitting element 20, and the upper-right light-emitting element 20 shown in FIG. 4 are defined as S1, S2, and S3, respectively, and that the distances between the centers of these light-emitting elements 20 and x axis (in the case shown in FIG. 4, the center coincides with the intersection point of diagonal lines drawn in each light-emitting element 20) are defined as y1, y2, and y1, respectively, then a moment about the x axis with respect to the origin O is expressed as: y1×S1+y2×S2+y1×S3. This moment is geometrical moment of area, and, a y-coordinate of the centroid yG is derived by dividing the geometrical moment of area by the total area expressed as: S1+S2+S3. That is, the following equation holds: yG=(y1×S1+y2×S2+y1×S3)/(S1+S2+S3).

Similarly, given that the distances between the centers of the light-emitting elements 20 and y axis are defined as x1, x2, and x3, respectively, then a moment about the y axis with respect to the origin O is expressed as: x1×S1+x2×S2+x3×S3. An x-coordinate of the centroid xG is derived by dividing the moment by the total area expressed as: S1+S2+S3. That is, the following equation holds: xG=(x1×S1+x2×S2+x3×S3)/(S1+S2+S3).

Moreover, the center of each of the first lens 17a and the second lens 17b refers to the center of the bottom surface of each lens.

By arranging the first light-emitting element group 20Aa and the first lens 17a in that way, the optical axis of light emitted from the light-emitting element group 20Aa through the first lens 17a is inclined toward the downstream side in the direction of object movement with respect to the normal to the upper surface of the base 10 (one main surface 11a), and also, by arranging the second light-emitting element group 20Ab and the second lens 17b in that way, the optical axis of light emitted from the light-emitting element group 20Ab through the second lens 17b is inclined toward the upstream side in the direction of object movement with respect to the normal to the upper surface of the base 10 (one main surface 11a). As a result, the intensity of light per unit area emitted from the light irradiation device 1 can be increased on a target object.

Figure 5:
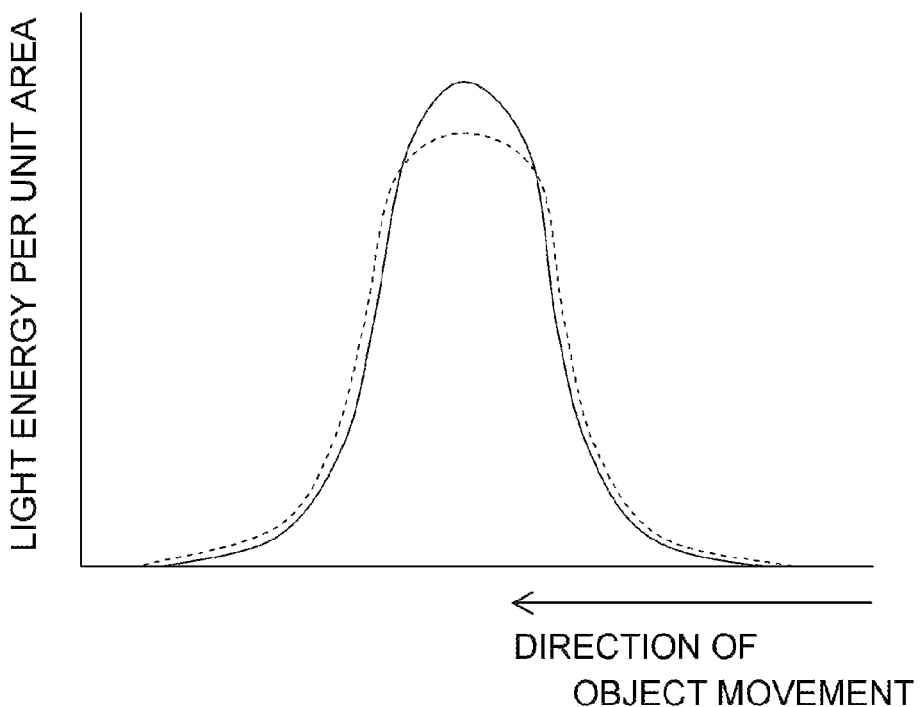
FIG. 5 is a view for explaining a difference of light intensity per unit area.

FIG. 5 schematically shows light intensity per unit area of the light irradiation device 1 in the direction of object movement. A solid line indicates the intensity of light per unit area as found in the case where the first light-emitting element group 20Aa and the first lens 17a, as well as the second light-emitting element group 20Ab and the second lens 17b, are arranged in a manner as practiced in the present embodiment, whereas a broken line indicates the intensity of light per unit area as found in a case where the center of the first light-emitting element group 20Aa is brought into coincidence with the center of the first lens 17a, and the center of the second light-emitting element group 20Ab is brought into coincidence with the center of the second lens 17b.

The area of a region enclosed by the horizontal axis and the solid line and the area of a region enclosed by the horizontal axis and the broken line each represent integral light energy, and, the former region and the latter region, while being equal to each other in respect of integral light energy, differ from each other in respect of the maximum value of light intensity per unit area. That is, the light irradiation device 1 of the present embodiment is capable of enhancement in light intensity per unit area.

As employed herein, the term "light intensity per unit area" refers to the intensity of light per unit area on a target object, and it may advisably be measured by a heretofore known method, namely by setting the light-receiving section of an ultraviolet meter on a target object. The intensity of light per unit area is also called "irradiance", and a unit of irradiance is W/cm$^2$, for example.

In the present embodiment, the optical axis of light emitted from the first light-emitting element group 20Aa through the first lens 17a and the optical axis of light emitted from the second light-emitting element group 20Ab through the second lens 17b are identically inclined with respect to the normal to the upper surface of the base 10 (one main surface 11a).

Further enhancement of light intensity per unit area can be achieved by making a degree of inclination of the optical axis of light emitted from the first light-emitting element group 20Aa through the first lens 17a with respect to the normal to the upper surface of the base 10 (one main surface 11a) smaller gradually from the upstream side to the downstream side in the direction of object movement, and making a degree of inclination of the optical axis of light emitted from the second light-emitting element group 20Ab through the second lens 17b with respect to the normal to the upper surface of the base 10 (one main surface 11a) smaller gradually from the downstream side to the upstream side in the direction of object movement.

(Light Irradiation Module)

Figure 6:
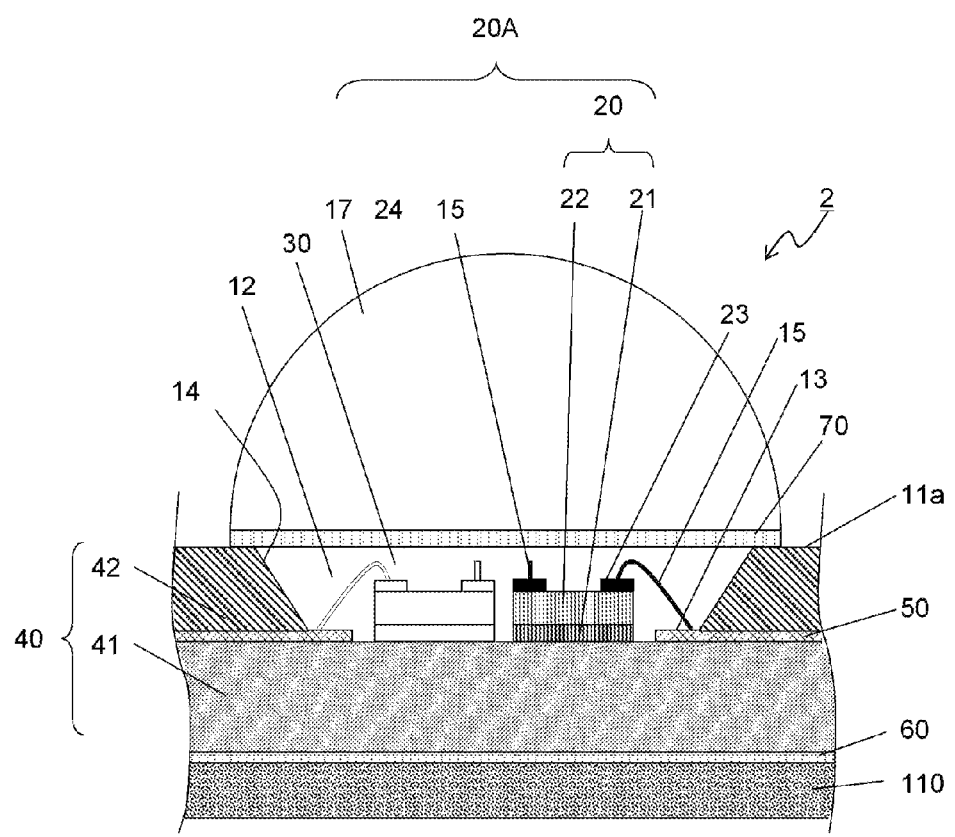
FIG. 6 is a sectional view showing the main part of a light irradiation module employing the light irradiation device shown in FIG. 1.

As shown in FIG. 6, a light irradiation module 2 of the present embodiment comprises; a heat-dissipating member 110; and the light irradiation device 1 placed on the heat-dissipating member 110. The light irradiation device 1 is placed on the main surface of the heat-dissipating member 110, via an adhesive 120 such as silicone resin or epoxy resin.

The heat-dissipating member 110 acts as a support for the light irradiation device 1, and also as a heat dissipator for dissipating heat liberated from the light irradiation device 1 to the outside. As the material constituting the heat-dissipating member 110, a material having high heat conductivity, for example, metal materials, ceramics, and resin materials of various types are desirable for use. In the present embodiment, the heat-dissipating member 110 is made of copper.

According to the light irradiation module 2 of the present embodiment, it is possible to afford the above-mentioned advantageous effects produced by the light irradiation device 1.

(Printing Apparatus)

Figure 7:
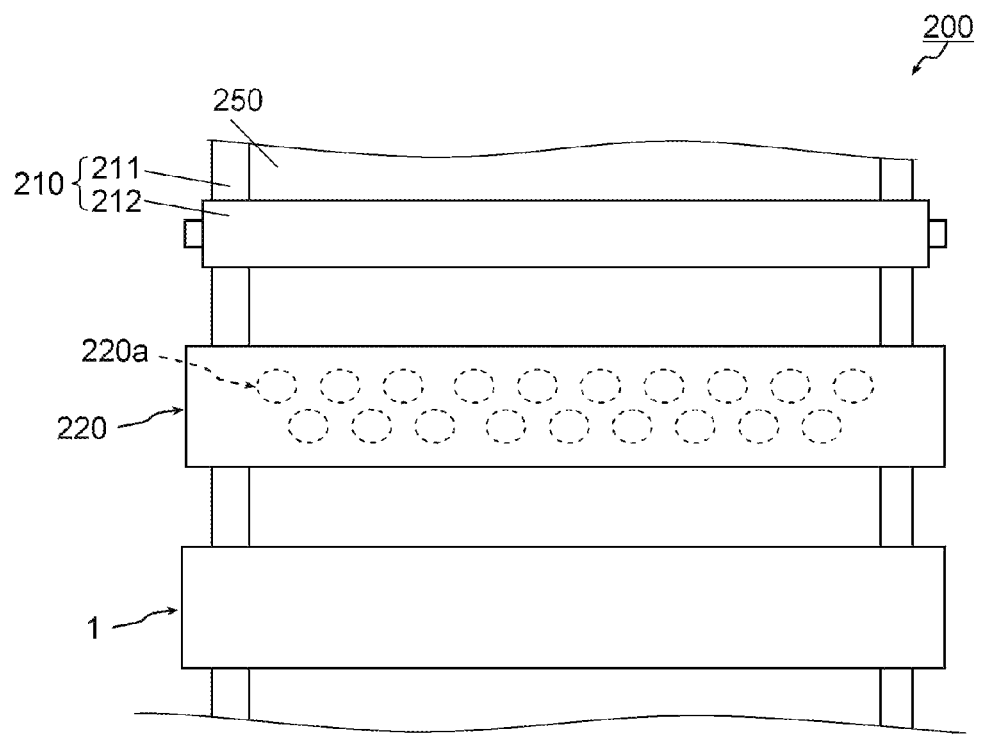
FIG. 7 is a top view of a printing apparatus employing the light irradiation device shown in FIG. 1.
Figure 8:
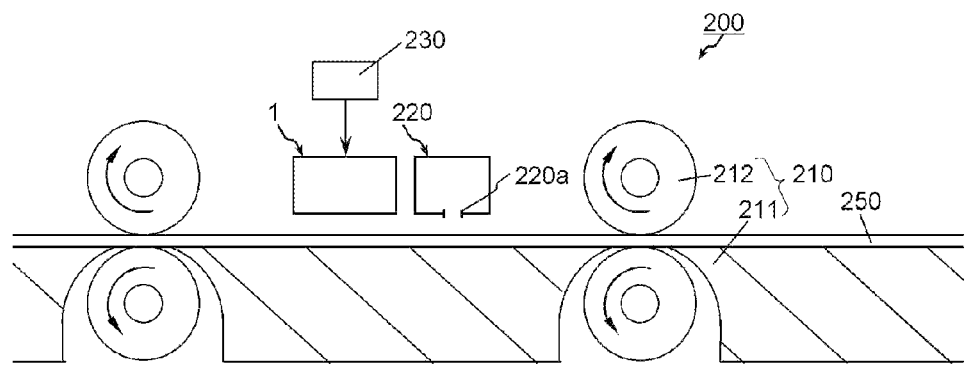
FIG. 8 is a side view of the printing apparatus shown in FIG. 7.

As shown in FIGS. 7 and 8, a printing apparatus 200 of the present embodiment comprises: a conveying part 210 for conveying a recording medium 250; a printing part 220 which acts as a printing mechanism for printing on the recording medium 250 under conveyance; the above-mentioned light irradiation device 1 for applying ultraviolet light to the recording medium 250 printed; and a control system 230 for controlling emission of light from the light irradiation device 1. The recording medium 250 is equivalent to the target object thus far described.

The conveying part 210, which is intended to convey the recording medium 250 in a manner such that is passes through the printing part 220 and the light irradiation device 1 sequentially in the order named, comprises: a placement table 211; and conveying rollers 212, taken as a pair, set face to face with each other while being rotatably supported. In the conveying part 210, the recording medium 250 supported by the placement table 211 is fed to a space between the paired conveying rollers 212, and, upon rotation of the conveying rollers 212, the recording medium 250 is conveyed in a conveyance direction.

The printing part 220 has the capability of adhering a photosensitive material to the recording medium 250 which is being conveyed via the conveying part 210. The printing part 220 discharges droplets containing the photosensitive material to the recording medium 250, thereby adhering the photosensitive material to the recording medium 250. In the present embodiment, an ultraviolet curable ink is adopted for use as the photosensitive material. Examples of the photosensitive material include, in addition to the ultraviolet curable ink, a photoresist and a photocurable resin.

In the present embodiment, line-type printing part is adopted for use as the printing part 220. The printing part 220 has a plurality of discharge holes 220$a$ linearly arranged in a main scanning direction, so that the ultraviolet curable ink can be discharged from these discharge holes 220$a$. The printing part 220 is configured to print on the recording medium by discharging the ink through the discharge holes 220$a$ for adhesion of the ink to the recording medium 250 which is being conveyed in a direction perpendicular to the array of the discharge holes 220$a$ (a sub scanning direction).

Although the line-type printing part exemplifies the printing mechanism in the present embodiment, for example, serial-type printing part, or a line-type or serial-type spraying head (for example, ink-jet head) may be adopted instead. It is also possible to adopt, as the printing mechanism, an electrostatic head in which static electricity is caused to accumulate in the recording medium 250 for adhesion of a photosensitive material to the recording medium 250 under the static electricity, or an immersion device in which the recording medium 250 is immersed in a photosensitive material in liquid form for adhesion of the photosensitive material to the recording medium 250. Moreover, a brush coater, a brush, a roller, and the like can be adopted for use as the printing mechanism.

In the printing apparatus 200, the light irradiation device 1 performs the function of exposing the photosensitive material adherent to the recording medium 250 which is being conveyed via the conveying part 210 to light. The light irradiation device 1 is located at the downstream side in the conveyance direction with respect to the printing part 220. Moreover, in the printing apparatus 200, the light-emitting element 20 performs the function of exposing the photosensitive material adherent to the recording medium 250 to light.

The control system 230 performs the function of controlling emission of light from the light irradiation device 1. In a memory of the control system 230, there is stored information indicative of characteristics of light which allows ink droplets discharged from the printing part 220 to cure in a relatively satisfactory manner. Specific examples of the information stored in the memory include wavelength distribution characteristics and numerical values representing light emission intensity (emission intensity in each wavelength range) suited to curing the discharge of ink droplets. By virtue of this control system 230, the printing apparatus 200 of the present embodiment is also capable of making adjustment to the magnitude of driving current which is inputted to a plurality of light-emitting elements 20 on the basis of the information stored in the control system 230. Thus, according to the printing apparatus 200 of the present embodiment, it is possible to achieve irradiation of light with adequate ultraviolet irradiation energy conforming to the characteristics of an ink in use, and thereby cure ink droplets with light of relatively low energy.

In the printing apparatus 200, the conveying part 210 conveys the recording medium 250 in the conveyance direction. The printing part 220 discharges an ultraviolet curable ink to the recording medium 250 under conveyance for adhesion of the ultraviolet curable ink to the surface of the recording medium 250. At this time, the ultraviolet curable ink which is caused to adhere to the recording medium 250 may be applied to either the entire area or part of the area of the recording medium 250, or may be applied in a predetermined adherent pattern to the recording medium 250. In this printing apparatus 200, the ultraviolet curable ink adherent to the recording medium 250 is cured under irradiation of ultraviolet rays emitted from the light irradiation device 1.

According to the printing apparatus 200 of the present embodiment, it is possible to afford the above-mentioned advantageous effects produced by the light irradiation device 1.

Although specific embodiments of the invention have been shown herein, it will be understood that the invention is not so limited, and thus many changes and modifications are possible without departing from the scope of the invention.

Figure 9:
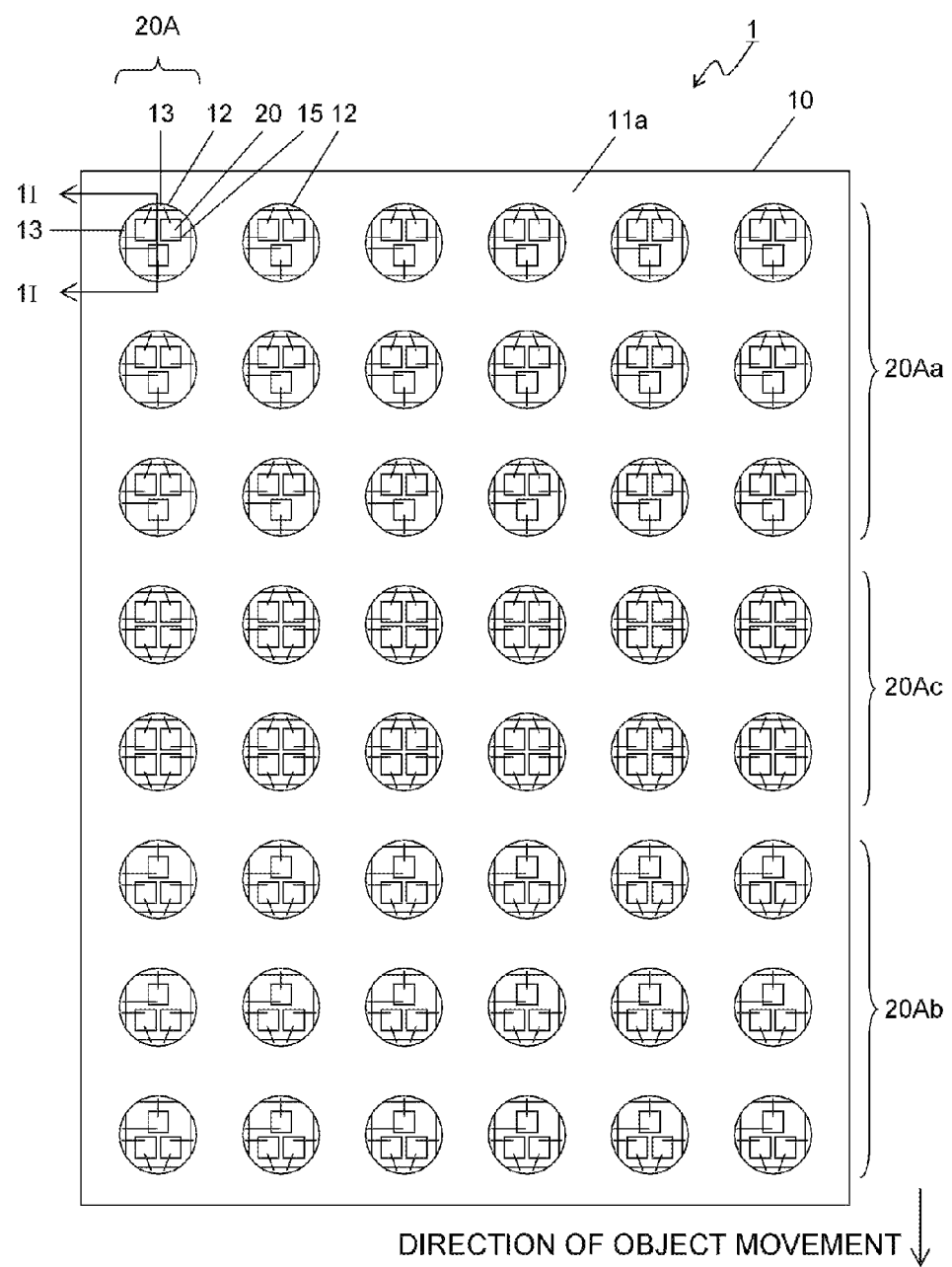
FIG. 9 is a view for explaining a first modified example of the light irradiation device shown in FIG. 1.

For example, as in a first modified example shown in FIG. 9, a plurality of third light-emitting element groups 20Ac and a plurality of third lenses 17$c$ corresponding thereto may additionally be disposed between the plurality of first light-emitting element groups 20Aa and the plurality of second light-emitting element groups 20Ab. In this case, an optical axis of light emitted through each of the plurality of third lenses 17$c$ runs in a direction along the normal to the upper surface of the base 10 (one main surface 11$a$). That is, in a plan view, the center of each of the plurality of third lenses 17$c$ is located at the center of its respective third light-emitting element group 20Ac. In this construction, further enhancement in light intensity per unit area can be achieved.

In the first modified example, the third light-emitting element group 20Ac is composed of four light-emitting elements 20, that is; the number of the light-emitting elements 20 constituting the third light-emitting element group 20Ac is greater than the number of the light-emitting elements 20 constituting each of the first light-emitting element group 20Aa and the second light-emitting element group 20Ab. In this construction, as compared with a case where the first light-emitting element group 20Aa, the second light-emitting element group 20Ab, and the third light-emitting element group 20Ac are equal in the number of constituent light-emitting elements 20, higher light intensity per unit area can be attained.

Although, in the first modified example, the number of the light-emitting elements 20 constituting the third light-emitting element group 20Ac is greater than the number of the light-emitting elements 20 constituting each of the first light-emitting element group 20Aa and the second light-emitting element group 20Ab, on the contrary, the third light-emitting element group 20Ac may have a fewer number of light-emitting elements 20 than those of the first and second light-emitting element groups in so far as a necessary level of light intensity per unit area can be attained. As a matter of course, the first light-emitting element group 20Aa, the second light-emitting element group 20Ab, and the third light-emitting element group 20Ac do not necessarily have to be equal in the number of constituent light-emitting elements 20, and thus, the number of the light-emitting elements 20 can be adjusted on an as needed basis.

Figure 10:
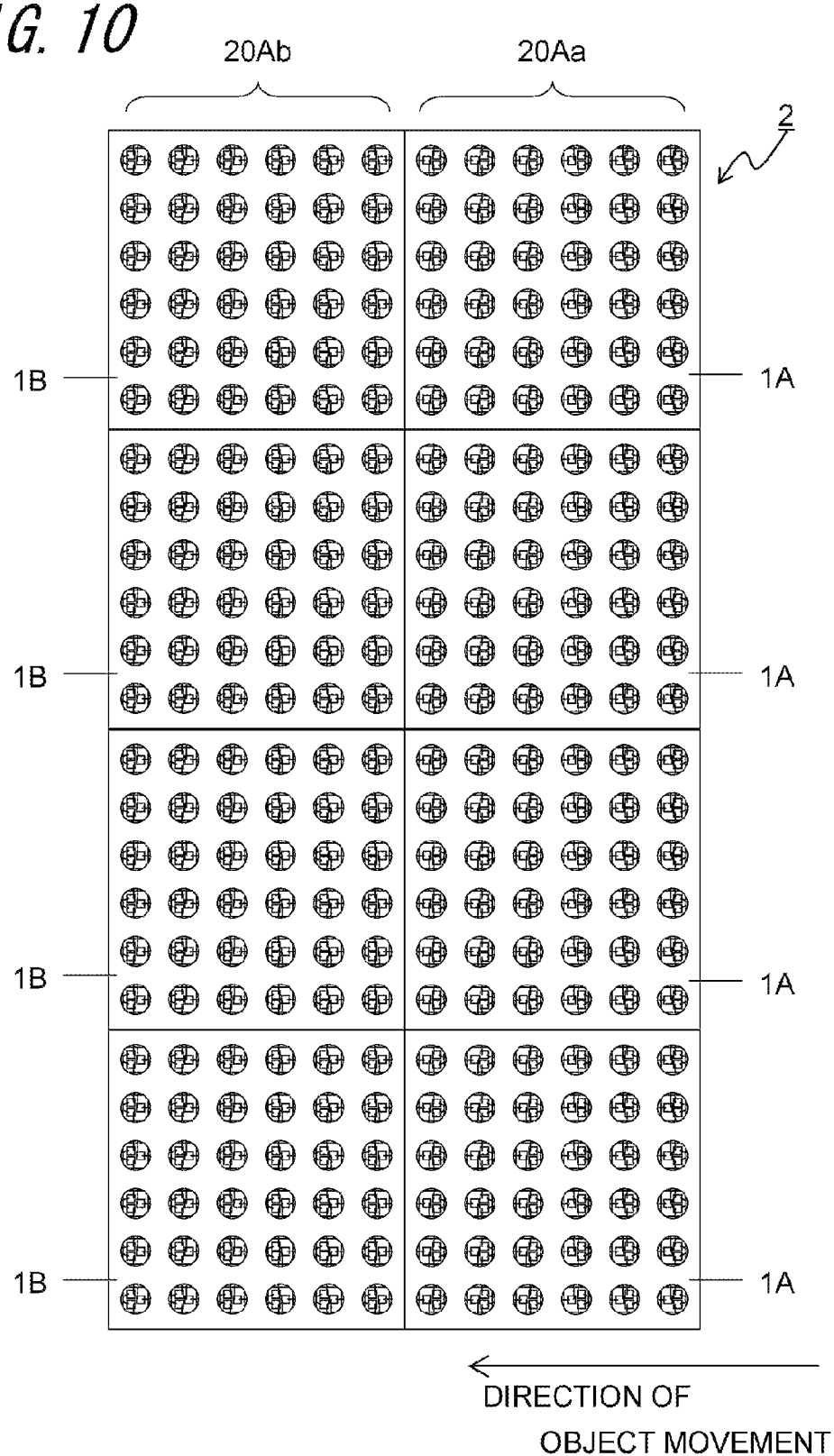
FIG. 10 is a view for explaining a second modified example of the light irradiation module shown in FIG. 6.

Moreover, for example, as in a second modified example of the light irradiation module 2 of the present embodiment as shown in FIG. 10, a plurality of light irradiation devices 1 constituting the light irradiation modules 2 may be arranged both in the direction of object movement and in a width direction perpendicular to the direction of object movement. In the second modified example, four light irradiation devices 1 are arranged in the width direction, and two light irradiation devices 1 are arranged in the direction of object movement. In this case, the light irradiation devices 1 are configured by light irradiation devices 1A located on the upstream side in the direction of object movement and light irradiation devices 1B located on the downstream side in the direction of object movement. The light irradiation device 1A is composed of the first light-emitting element groups 20Aa, and the light irradiation device 1B is composed of the second light-emitting element groups 20Ab. The light irradiation module 2 thereby constructed is capable of affording the same effects as achieved in the light irradiation device 1.

Moreover, the printing apparatus 200 of the present embodiment may be built as, for example, a so-called offset printer in which a roller supported by a shaft thereof is rotated so that a recording medium can be conveyed along a surface of the roller. Also in this case, the same effects can be attained.

Although the above-mentioned embodiment is exemplified by a construction implemented by applying the light irradiation device 1 to the printing apparatus 200 employing the ink-jet head 220, the light irradiation device 1 can find applications also in devices for curing various types of photocurable resins, for example, a specific-purpose curing device for curing a photocurable resin spin-coated to the surface of a target object. Moreover, the light irradiation device 1 may be used as an irradiation light source provided in an exposure device.

It is obviously needless to say that the light irradiation module 2 can be applied to the printing apparatus 200 instead of the light irradiation device 1.

REFERENCE SIGNS LIST

1: Light irradiation device
2: Light irradiation module
10: Base
11a: One main surface
12: Opening
13: Connection pad
14: Inner peripheral surface
15: Joining material
17: Lens
17a: First lens
17b: Second lens
17: Lens adhesive
20: Light-emitting element
20A: Light-emitting element group
20Aa: First light-emitting element group
20Ab: Second light-emitting element group
22: Semiconductor layer
23, 24: Element electrode
30: Sealing material
40: Stacked body
41: First insulating layer
42: Second insulating layer
50: Electrical wiring
110: Heat-dissipating member
120: Adhesive
200: Printing apparatus
210: Conveying part
211: Placement table
212: Conveying roller
220: Printing part
220a: Discharge hole
230: Control system
250: Recording medium

The invention claimed is:

1. A light irradiation device for applying light to a target object under relative movement, comprising:
  a base;
  a plurality of light-emitting element groups, each of the plurality of light-emitting element groups having a plurality of light-emitting elements, the plurality of light-emitting elements being arranged in a matrix form on an upper surface of the base; and
  a plurality of lenses configured to cover the light-emitting element groups, respectively, the plurality of lenses radiating light emitted from the light-emitting element groups outwardly, wherein
  the plurality of light-emitting element groups comprise
    a plurality of first light-emitting element groups located on an upstream side in a movement direction in which the target object is moved relative to the light irradiation device, and
    a plurality of second light-emitting element groups located on a downstream side in the movement direction,
  the plurality of lenses comprise
    a plurality of first lenses which cover the plurality of first light-emitting element groups, respectively, and
    a plurality of second lenses which cover the plurality of second light-emitting element groups, respectively,
    an optical axis of light emitted through each of the plurality of first lenses and an optical axis of light emitted through each of the plurality of second lenses are inclined with respect to a normal to the upper surface of the base,
    the optical axis of light emitted through each of the plurality of first lenses is inclined toward the downstream side in the movement direction with respect to the normal to the upper surface of the base, and
    the optical axis of light emitted through each of the plurality of second lenses is inclined toward the upstream side in the movement direction with respect to the normal to the upper surface of the base.

2. The light irradiation device according to claim 1, wherein a center of each of the plurality of first lenses as seen in a plan view is located at the downstream side in the movement direction with respect to a center of the first light-emitting element group corresponding to the each of the plurality of first lenses as seen in a plan view, and
  a center of each of the plurality of second lenses as seen in a plan view is located at the upstream side in the movement direction with respect to a center of the second light-emitting element group corresponding to the each of the plurality of second lenses as seen in a plan view.

3. The light irradiation device according to claim 1, wherein an arrangement interval in the movement direction between the plurality of first lenses and an arrangement interval in the movement direction between the plurality of second lenses are equal to each other.

4. The light irradiation device according to claim 1, wherein a degree of inclination of the optical axis of light emitted through each of the plurality of first lenses with respect to the normal to the upper surface of the base becomes smaller gradually from the upstream side to the downstream side in the movement direction, and a degree of inclination of the optical axis of light emitted through each of the plurality of second lenses with respect to the normal to the upper surface of the base becomes smaller gradually from the downstream side to the upstream side in the movement direction.

5. The light irradiation device according to claim 1, further comprising:
a plurality of third light-emitting element groups and a plurality of third lenses corresponding to the plurality of third light-emitting element groups, respectively, the plurality of third light-emitting element groups and the plurality of third lenses being disposed between the plurality of first light-emitting element groups and the plurality of second light-emitting element groups,
wherein an optical axis of light emitted through each of the plurality of third lenses runs in a direction along the normal to the upper surface of the base.

6. The light irradiation device according to claim 5, wherein a center of each of the plurality of third lenses as seen in a plan view is located at a center of the third light-emitting element group corresponding to the each of the plurality of third lenses as seen in a plan view.

7. The light irradiation device according to claim 5, wherein an arrangement interval in the movement direction between the plurality of first lenses, an arrangement interval in the movement direction between the plurality of second lenses, and an arrangement interval in the movement direction between the plurality of third lenses are equal to one another.

8. A light irradiation module, comprising:
a heat-dissipating member; and
a plurality of light irradiation devices according to claim 1, the plurality of light irradiation devices being disposed on the heat-dissipating member.

9. A printing apparatus, comprising:
a printing part configured to print on a recording medium; and
the light irradiation module according to claim 8, the light irradiation module applying light to a recording medium printed.

* * * * *